United States Patent [19]

van Dyk Soerewyn

[11] Patent Number: 4,626,478
[45] Date of Patent: Dec. 2, 1986

[54] ELECTRONIC CIRCUIT DEVICE COMPONENTS HAVING INTEGRAL SPACERS PROVIDING UNIFORM THICKNESS BONDING FILM

[75] Inventor: Herman F. van Dyk Soerewyn, Peabody, Mass.

[73] Assignee: Unitrode Corporation, Lexington, Mass.

[21] Appl. No.: 592,220

[22] Filed: Mar. 22, 1984

[51] Int. Cl.$^4$ ............................................. H01L 23/48
[52] U.S. Cl. ................................. 428/596; 428/603; 428/615; 428/929; 357/70
[58] Field of Search ............... 228/258, 173 C, 180 A; 357/70, 69; 339/275 B; 428/596, 544, 594, 603, 615, 929

[56] References Cited

U.S. PATENT DOCUMENTS

| | | | |
|---|---|---|---|
| 1,618,611 | 2/1927 | Trout | 228/258 |
| 3,089,062 | 5/1963 | Schulz | 339/275 B |
| 3,805,373 | 4/1974 | Sarolainen et al. | 228/258 |
| 3,947,867 | 3/1976 | Duffek et al. | 357/70 |
| 4,147,889 | 4/1979 | Andrews et al. | 357/70 |
| 4,346,396 | 8/1982 | Carroll et al. | 357/70 |
| 4,396,457 | 8/1983 | Bakermans | 357/70 |
| 4,402,450 | 9/1983 | Abraham et al. | 228/180 A |
| 4,438,181 | 3/1984 | Schroeder | 428/596 |

FOREIGN PATENT DOCUMENTS

| | | | |
|---|---|---|---|
| 48532 | 4/1977 | Japan | 228/173 C |
| 19652 | 2/1979 | Japan | 228/180 A |
| 82552 | 5/1983 | Japan | 357/70 |
| 207645 | 12/1983 | Japan | 357/70 |

OTHER PUBLICATIONS

"Metallurgical Dictionary", Henderson et al, Reinhold Publishing Corp., NY, NY, 1953, p. 296, Solder.

Primary Examiner—L. Dewayne Rutledge
Assistant Examiner—John J. Zimmerman
Attorney, Agent, or Firm—Weingarten, Schurgin, Gagnebin & Hayes

[57] ABSTRACT

Spacing elements are integrally formed on the constituent surfaces of conductive interfaces of electronic circuit device components for providing uniform thickness solder or other bonding film between the surfaces. The interfaces may be electrically conductive interfaces such as those defined between leads and substrate contact pads as well as thermally conductive interfaces such as those defined between heat sinks and substrates. Any suitable spacers which maintain the constitutent surfaces a selected distance apart when the components are pressed together may be employed such as edge and corner flanges, convex dimples, annular protrusions, tangs, among others. A tool is disclosed for forming the annular protrusions that is advantageously employed with comparatively thick electronic circuit device components and with laminated electronic circuit device components having a comparatively hard layer.

11 Claims, 11 Drawing Figures

ELECTRONIC CIRCUIT DEVICE COMPONENTS HAVING INTEGRAL SPACERS PROVIDING UNIFORM THICKNESS BONDING FILM

FIELD OF THE INVENTION

This invention is directed to the field of electronic circuit device manufacture, and more particularly, to novel electronic circuit device components having integral spacers providing uniform thickness bonding film.

BACKGROUND OF THE INVENTION

Electronic circuit devices usually consist of several components having selected surfaces between the components defining intended electrical and thermal interfaces. Such components typically include an IC (integrated circuit) or hybrid substrate having a plurality of contact pads, a lead frame having a like plurality of leads, and a heat sink. During assembly, the substrate, heat sink, and lead frame are typically pressed together at a selected compression in an assembly fixture, with each of the leads aligned with and contacting its associated contact pad via a corresponding solder layer and with the heat sink aligned with and contacting the substrate via a solder layer, and heated at a high tempeature to flow the solder. Because of the differential in the coefficients of thermal expansion between the several components and between the different components of the assembly fixture, as well as high temperature induced component warping, among other things, it often happens however that the selected compression either over-compresses or under-compresses the thermal and electrical interfaces. In the former case the components are over-compressed, which squeezes the solder out from between the electrical interfaces producing electrical shorts between adjacent leads, and which squeezes the solder out from between the thermal interface producing an undesirable bond. In the latter case the components are under-compressed, which due to the surface tension of the solder, causes it to form into solder balls in the electrical interfaces both producing electrically open or weak bonds and entrapping gas, and likewise producing an undesirably high resistance path and entrapping gas or flux at the thermal interface.

SUMMARY OF THE INVENTION

The present invention comtemplates means coupled to the electrical and thermal interfaces defined between the components of electronic circuit devices that is operative to provide uniform thickness bonding film therebetween. In the preferred embodiment, the interfaces are provided with spacers integrally formed on at least one of their constituent surfaces that maintain a selected spacing between the constituent surfaces defining the interfaces thereby providing uniform thickness bonding film therebetween. The spacers are preferably integrally formed on the ends of the leads of a lead frame that abut corresponding ones of the contact pads of a substrate to provide uniform thickness bonding film in the corresponding electrical interfaces. The spacers are preferably integrally formed in an intended pattern on a heat sink to provide uniform thickness bonding film along the thermal interface defined between the heat sink and the substrate. The spacers can advantageously have several embodiments including convex dimples, annular protrusions, edge flanges, corner flanges, and central tangs. The annular protrusions are preferable for comparatively thick components or hard components such as composite metal heat sinks. A tool is provided that is operative to form the annular protrusions. The central tangs preferably define an opening between confronting tangs that allow the escape of gas therethrough, thereby preventing gas entrapment. Conductive epoxy, braze, glue, solder and other conductive bonds may be employed without departing from the inventive concept.

BRIEF DESCRIPTION OF THE DRAWINGS

Other features and advantages of the present invention will become apparent as the invention becomes better understood by referring to the following exemplary and non-limiting detailed description of the preferred embodiments, and to the drawings, wherein.

DETAILED DESCRIPTION OF THE PREFERRED EMBODIMENTS

Figure 1A:
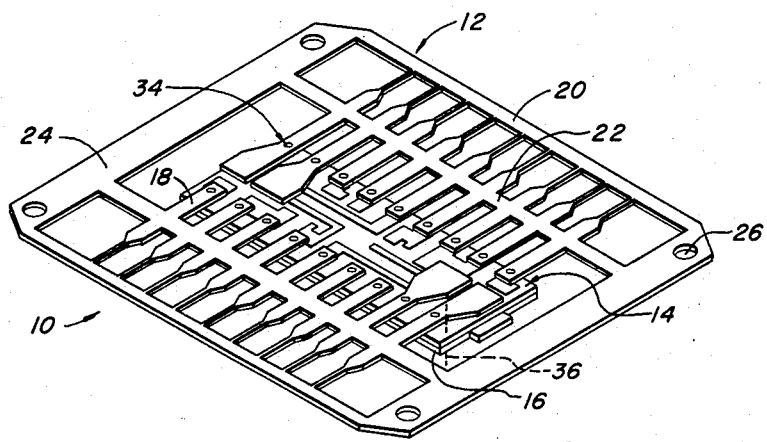
FIG. 1A is a perspective view illustrating an exemplary assembly of electronic circuit device components having integral spacers providing uniform thickness solder film according to the present invention.

Referring now to FIG. 1A, generally designated at 10 is a perspective view illustrating an exemplary assembly of electronic circuit device components having integral spacers providing uniform thickness solder film according to the present invention. The assembly 10 includes a lead frame generally designated 12, an IC or hybrid substrate generally designated 14, and a heat sink generally designated 16.

The lead frame 12 is a metallic plate having an apertured pattern defining a plurality of longitudinally extending electrodes 18 connected on their outer ends to a transversely extending tie bar 20, and connected at a point intermediate their ends to a transversely extending dam bar 22. The tie bar 20 and the dam bar 22 are connected to longitudinally extending connector strips 24 that form the sides of the lead frame 12. Apertures generally designated 26 are provided at each of the ends of the connector strips 24.

Figure 1B:
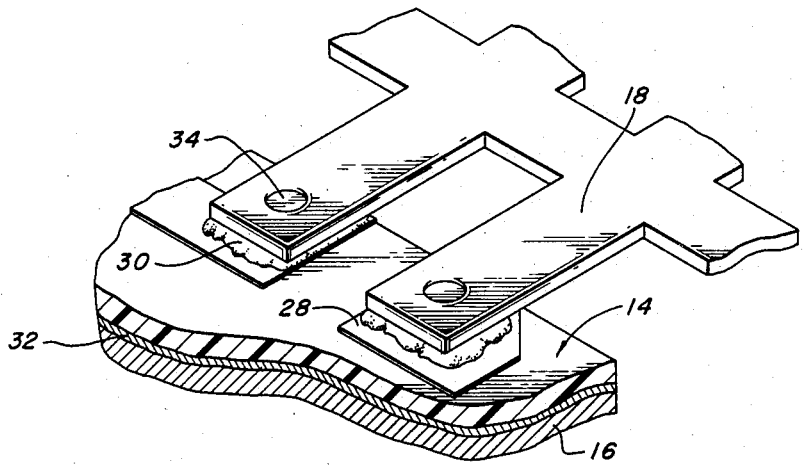
FIG. 1B is an enlarged perspective view illustrating a portion of the assembly of FIG. 1A.

A plurality of contact pads 28, best seen in FIG. 1B, are provided on the substrate 14. The pads 28 are in electrical communication with active electronic components, not shown, disposed on the substrate 14 via printed circuit or other conductive paths. The substrate 14 is so positioned on the lead frame 12 that individual ones of the contact pads 28 rest on corresponding ones of the inner ends of the electrodes 18 defining between the confronting surfaces thereof a plurality of electrical interfaces.

The heat sink 16 is positioned on the substrate 14 defining between the confronting surfaces thereof a thermal interface.

A layer of a fusable material 30 (FIG. 1B) such as solder, braze, or a conductive epoxy is provided in the electrical interfaces. A layer of a fusable material 32 (FIG. 1B) such as solder, braze, or a conductive epoxy is provided in the thermal interface.

Figure 1C:
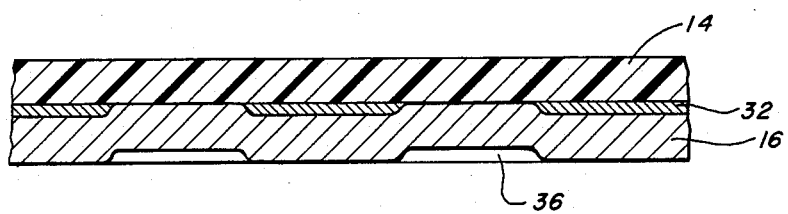
FIG. 1C is an enlarged sectional view illustrating another portion of the assembly of FIG. 1A.

A spacer generally designated 34 to be described is integrally formed proximate the inner ends of each of the leads 18 in each of the electrical interfaces. A plurality of spacers 36 are integrally formed in an intended pattern on the heat sink 16 in the thermal interface as can best be seen in FIG. 1C. Compression is applied by any suitable tensioning fixture, not shown, to press the assembly 10 together. The assembly 10 is then heated to flow the solder layers 30, 32 between the electrical and thermal interfaces, for example in a furnace, not shown. The integral spacers 34, 36 maintain over a wide range of compression the constituent surfaces defining the corresponding electrical and thermal interfaces a preselected uniform distance apart, thereby providing uniform thickness solder film therebetween that is free of gas inclusions, solder "balling", electrically-shorted leads, and defective and weak conductive bonds. The only limitation being that the compression be greater than a minimum compression sufficient to press the components together and a maximum compression just less than the plastic deformation threshold of the components.

Figure 2A:
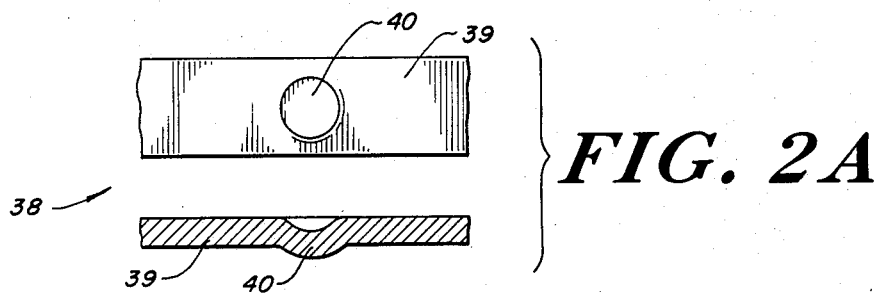
FIG. 2A-B is an enlarged fragmentary view illustrating a lead of a lead frame having one embodiment of the integral spacers providing uniform thickness solder film according to the present invention.
Figure 2B:
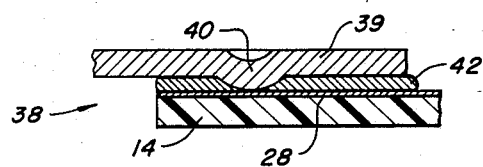

Referring now to FIG. 2A-B, generally designated at 38 is an enlarged fragmentary view illustrating a lead of a lead frame having one embodiment of the integral spacers providing uniform thickness solder film according to the present invention. A lead 39 includes an integral convex portion 40 that projects beyond the surface of the inner end of the lead 39 forming a dimple as shown in FIG. 2A. The dimple abuts an associated contact pad 28 of a substrate 14 and uniformly spaces the constituent surfaces of the corresponding electrical interface apart providing uniform thickness solder film 42 therebetween as shown in FIG. 2B.

Figure 3:
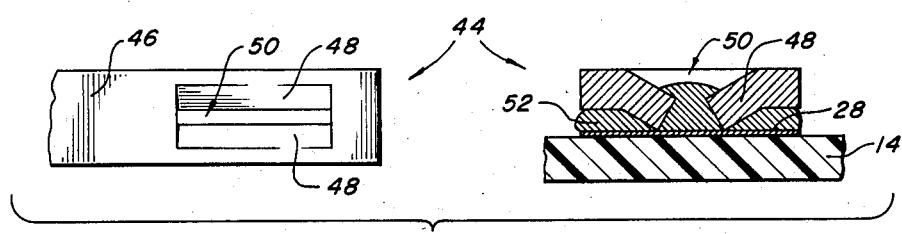
FIG. 3 is an enlarged fragmentary view illustrating a lead of a lead frame having another embodiment of the integral spacers providing uniform thickness solder film according to the present invention.

Referring now to FIG. 3, generally designated at 44 is an enlarged fragmentary view illustrating a lead of the lead frame having another embodiment of the integral spacers providing uniform thickness solder film according to the present invention. A lead 46 includes integral confronting longitudinally extending tangs 48 defining therebetween a central opening generally designated 50. The tanks 48 each project beyond the surface of the inner end of the lead 46. The tangs 48 each abut an associated contact pad 28 of a substrate 14 and uniformly spaces the constituent surfaces of the corresponding electrical interface apart providing uniform thickness solder film 52. During soldering, it will be appreciated that any gas escapes through the central opening 50 preventing its entrapment.

Figure 4:
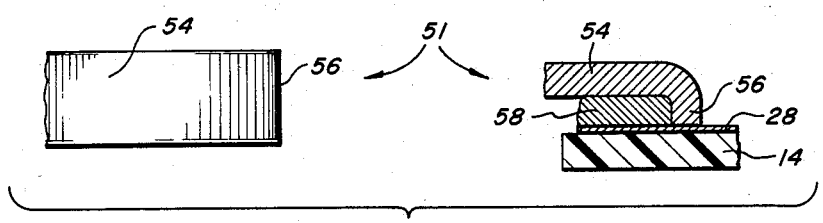
FIG. 4 is an enlarged fragmentary view illustrating a lead of a lead frame having another embodiment of the integral spacers providing uniform thickness solder film according to the present invention.

Referring now to FIG. 4, generally shown at 51 is an enlarged fragmentary view illustrating a lead of a lead frame having another embodiment of the integral spacers providing uniform thickness solder film according to the present invention. A lead 54 includes a flange 56 integrally formed on an end of the lead 54 that projects beyond the surface of the inner end of the lead 54. The flange 56 abuts an associated contact pad 28 on a substrate 14 and uniformly spaces the constituent surfaces of the corresponding electrical interface apart providing uniform thickness solder film 58 therebetween.

Figure 5:
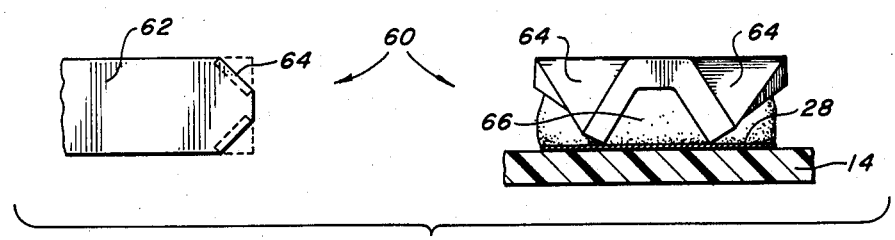
FIG. 5 is an enlarged fragmentary view illustrating a lead of a lead frame having yet another embodiment of the integral spacers providing uniform thickness solder film according to the present invention.

Referring now to FIG. 5, generally designated at 60 is an enlarged fragmentary view illustrating a lead of a lead frame having another embodiment of the integral spacers providing uniform thickness solder film according to the present invention. A lead 62 includes flanges 64 integrally formed at the corners of the lead 62 that project beyond the surface of the inner end of the lead 62. The corner flanges 64 abut an associated contact pad 28 of a substrate 14 and uniformly spaces the constituent surfaces defining the corresponding electrical interface apart providing uniform thickness solder film 66 therebetween.

It will be appreciated that the integral spacers described above in connection with the description of the embodiments of FIGS. 2-5 can be utilized for other electronic circuit device components such as heat sinks without departing from the inventive concept. The integral spacers can also have any selected geometry including square, elongated, or other shape. The integral spacers illustrated in the embodiments of FIGS. 2-5 are particularly advantageous where the leads and/or heat sink have such a dimension and/or material as to allow them to be readily formed and/or punched through.

Figure 6:
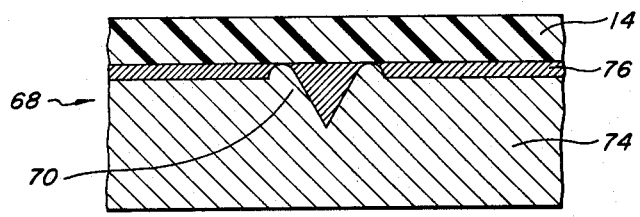
FIG. 6 is an enlarged fragmentary sectional view illustrating a heat sink having a further embodiment of the integral spacers providing uniform thickness solder film according to the present invention.
Figure 7:
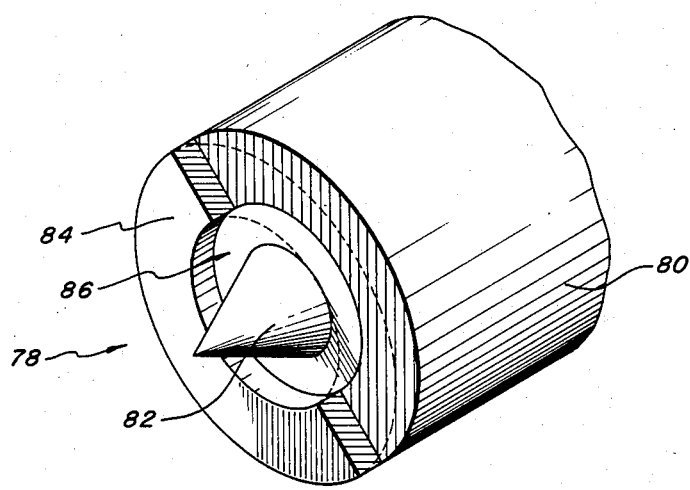
FIG. 7 is an enlarged fragmentary isometric view illustrating a tool for forming the embodiment of the integral spacers providing uniform thickness solder film of FIG. 6.
Figure 8:
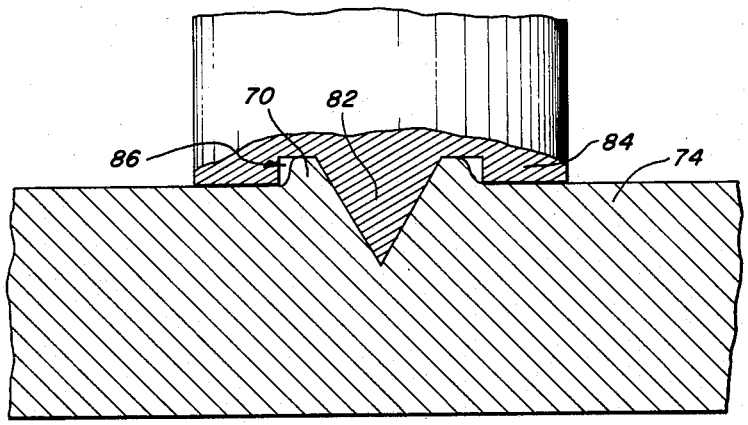
FIG. 8 is a sectional view useful in illustrating the operation of the tool of FIG. 7.

Referring now to FIG. 6, generally designated at 68 is an enlarged fragmentary sectional view illustrating a heat sink having another embodiment of the integral spacers providing uniform thickness solder film according to the present invention. The integral spacers of the embodiment of FIG. 6 have particular utility where the heat sink (and/or leads) have a thickness much greater than the intended solder film dimension, have a hardness that makes it practicably impossible to bend or punch the material of the electronic circuit device components into one of the configurations illustrated in the embodiments of FIGS. 2-5, or have a laminated construction having a layer of comparatively hard material. An annular protrusion 70 is integrally formed on a heat sink 74 that projects beyond the surface of the heat sink 74. The annular protrusion 70 abuts a substrate 14 and spaces the constituent surfaces defining the corresponding thermal interface apart providing uniform thickness solder film 76 therebetween. The protrusion 70 may be formed by any suitable means. The annular protrusion 70 can be advantageously formed by staking the surface of the heat sink 74 by a tool generally designated 78 in FIG. 7. The tool 78 includes a shank 80 having on one end thereof a central sharpened point 82 that is surrounded by an annular flange 84 defining therebetween a shaping annulus generally designated 86. As illustrated in FIG. 8, as the sharpened point 82 is driven into the heat sink 74, the material surrounding the point 82 plastically flows into the shaping annulus 86 forming the annular protrusion 70.

It will be appreciated that many modifications of the presently disclosed invention will become apparent to those skilled in the art without departing from the scope of the appended claims.

What is claimed is:

1. A composite article providing a uniform thickness conductive bond in a conductive interface defined by first and second generally planar constituent surfaces of an electrical lead and the contact pad of an electronic circuit device component, comprising:

an electrically conductive bonding material disposed in said conductive interface;

a spacer integrally formed with said substantially planar electrical lead that projects towards said contact pad for uniformly spacing said constituent surfaces of said conductive interface a preselected non-zero distance apart defining a uniform thickness interspace therebetween; and means integrally formed with said lead for providing an opening therethrough through-which gases produced by the conductive bonding material disposed in the interface may exit.

2. The invention of claim 1, wherein said spacer includes a projection integrally pressed into said lead as to project beyond said substantially planar surface of said lead in a direction toward said contact pad.

3. The invention of claim 2, wherein said projection has a convex surface when viewed in a direction defined from said contact pad along said interface.

4. The invention of claim 2, wherein said dimple has an annular surface.

5. The invention of claim 1, wherein said spacer includes a flange that projects beyond said surface of said lead in a direction toward the contact pad surface.

6. The invention of claim 5, wherein said flange is integrally formed along an edge of said lead.

7. The invention of claim 5, wherein said flange is integrally formed along at least one corner of said at least one of said first and second surfaces lead.

8. The invention of claim 1, wherein said electrically conductive bonding material is a conductive epoxy.

9. The invention of claim 1, wherein said electrically conductive bonding material is a brazing material.

10. The invention of claim 1, wherein said electrically conductive bonding material is a solder.

11. A composite article providing a uniform thickness conductive bond in a conductive interface defined by first and second constituent surfaces of first and second electronic circuit device components, comprising:

a conductive bonding material disposed in said conductive interface; and first and second spaced apart and confronting tangs integrally formed on at least one of said first and said second surfaces at points therealong remote from their edges that each project beyond said at least one of said first and second surfaces in a direction toward the other one of said first and second surfaces for uniformly spacing said constituent surfaces of said interface a preselected non-zero distance apart defining a uniform thickness innerspace therebetween and that together define between the tangs a gap that allows the exit of gas therethrough.

* * * * *

UNITED STATES PATENT AND TRADEMARK OFFICE
CERTIFICATE OF CORRECTION

PATENT NO. : 4,626,478

DATED : December 2, 1986

INVENTOR(S) : Herman F. van Dyk Soerewyn

It is certified that error appears in the above-identified patent and that said Letters Patent is hereby corrected as shown below:

Title page:

ABSTRACT, line 9, "constitutent" should read --constituent--.

Column 1, line 25, "tempeature" should read --temperature--.

Column 2, line 4, "allow" should read --allows--.

Column 6, lines 7-8, "said at least one of said first and second surfaces lead." should read --said lead.--.

Signed and Sealed this

Eighth Day of March, 1988

Attest:

DONALD J. QUIGG

*Attesting Officer*   *Commissioner of Patents and Trademarks*